United States Patent [19]

Imanishi et al.

[11] Patent Number: 5,705,434
[45] Date of Patent: Jan. 6, 1998

[54] METHOD OF MANUFACTURING THERMOELECTRIC CONVERSION MODULE

[75] Inventors: Yuichiro Imanishi; Makoto Miyoshi; Tetsuo Watanabe, all of Nagoya; Keiko Kushibiki, Fujisawa; Kazuhiko Shinohara, Yokohama; Masakazu Kobayashi, Yokosuka; Kenji Furuya, Yokohama, all of Japan

[73] Assignees: NGK Insulators, Ltd.; Nissan Motor Co., Ltd., both of Japan

[21] Appl. No.: 744,599

[22] Filed: Nov. 7, 1996

[30] Foreign Application Priority Data

Nov. 13, 1995 [JP] Japan ..................... 7-294349
Oct. 24, 1996 [JP] Japan ..................... 8-282481

[51] Int. Cl.⁶ .................. H01L 21/324; H01L 21/477; H01L 35/34; H01L 35/28
[52] U.S. Cl. .................. 437/247; 437/903; 136/201; 136/224; 136/225; 136/230
[58] Field of Search ................ 136/201, 224, 136/225, 230; 62/3.2, 3.3; 257/467, 468, 469; 437/903, 247

[56] References Cited

U.S. PATENT DOCUMENTS

| | | | |
|---|---|---|---|
| 3,248,777 | 5/1966 | Stoll | 136/201 |
| 3,252,205 | 5/1966 | Hancock et al. | 136/201 |
| 3,264,714 | 8/1966 | Baer, Jr. | 136/225 |
| 3,851,381 | 12/1974 | Alais et al. | 437/903 |
| 4,149,025 | 4/1979 | Niculescu | 437/903 |

FOREIGN PATENT DOCUMENTS

| | | |
|---|---|---|
| 58-199578 | 11/1983 | Japan . |
| 61-263176 | 11/1986 | Japan . |
| 5-283753 | 10/1993 | Japan . |
| 7-162039 | 6/1995 | Japan . |
| 8-18109 | 1/1996 | Japan . |
| 2 120 455 | 11/1982 | United Kingdom . |

Primary Examiner—Brian Dutton
Attorney, Agent, or Firm—Parkhurst,Wendel & Burr,L.L.P

[57] ABSTRACT

A thermoelectric conversion module having a large capacity and a curved surface which can be secured to a corresponding curved surface of a base member is manufactured by inserting N type and P type semiconductor strips into through holes formed in a honeycomb structural body, filling spaces between walls defining the through holes and the semiconductor strips with filler members, cutting the honeycomb structural body into a plurality of thermoelectric conversion module main bodies each having a desired surface configuration, providing metal electrodes on both surfaces of a thermoelectric conversion module main body such that alternate N type and P type semiconductor elements are connected in cascade, and removing the filler members or the honeycomb structural body and filler members.

5 Claims, 4 Drawing Sheets

METHOD OF MANUFACTURING THERMOELECTRIC CONVERSION MODULE

BACKGROUND OF THE INVENTION

1. Field of the Invention

The present invention relates to a method of manufacturing thermoelectric conversion module for use in an apparatus utilizing a thermoelectric effect such as electronic cooling apparatus and electric power generating apparatus, and more particularly to a thermoelectric conversion module having N type semiconductor elements and P type semiconductor element connected in cascade or in series by means of metal electrodes.

2. Related Art Statement

There have been proposed various kinds of thermoelectric conversion modules utilizing the Seebeck effect, Peltier effect and Thomson effect. Among these thermoelectric conversion modules, there have been realized a Seebeck effect element and Peltier effect element, in which a thermoelectric element is formed by joining difference kinds of metals. In the Seebeck effect element, different kinds of metals are joined to constitute a closed lop, and thermoelectricity is generated by making junctions at different temperatures. Such a Seebeck effect element may be utilized as thermoelectricity element. In the Peltier effect element, different kinds of metals are joined to form a closed loop and an electric current is passed through the loop in a given direction to produce heat absorption at one junction point and heat generation at the other junction point. Such a thermoelectric element may be utilised as a thermoelectric heating element or thermoelectric cooling element. In order to improve the efficiency of these elements, junctions between semiconductor and metal have been widely used.

FIG. 1 is a schematic view showing a principal structure of a known thermoelectric conversion module constructed according to the above mentioned thermoelectric element. The thermoelectric conversion module comprises a number of N type semiconductor elements 1 and a number of P type semiconductor elements 2, said N and P type semiconductor elements being arranged alternately. Adjacent N type and P type semiconductor elements 1 and 2 are connected in cascade or in series by means of electrodes 3 made by metal strips. The left side N type semiconductor element 1 and the right side P type semiconductor element 2 of the cascade connection semiconductor element array are connected to opposite ends of a load 4. One side of the semiconductor array is placed in a higher temperature environment and the other side is placed in a lower temperature environment. Then, in each of the N type semiconductor elements 1, electrons flow from the high temperature side to the low temperature side as shown by slid lines (an electric current flows from the low temperature side to the high temperature side). In each of the P type semiconductor elements 2, holes flow from the high temperature side to the low temperature side as depicted by broken lines (an electric current flows from the high temperature side to the low temperature side). Therefore, a voltage is applied across the load 4 with a polarity as depicted in FIG. 1. The semiconductor elements 1 and 2 may be made of Bi-Te semiconductor (for instance $Bi_2Te_3$), Bi-Sb semiconductor (for example $Bi_{0.88}Sb_{0.12}$) or Si-Ge (for instance $Si_{0.8}Ge_{0.2}$).

FIG. 2 is a perspective view showing a known method of manufacturing the above mentioned known thermoelectric conversion module. On a surface of an insulating substrate 5 are secured electrode metal strips 6 by brazing in accordance with a given pattern. Then, N type semiconductor elements 1 and P type semiconductor elements 2 are secured electrode metal strips 6 by brazing or soldering. The semiconductor elements 1 and 2 may be formed by cutting a single crystal melting method or a sintered semiconductor material. On upper surfaces of the N type and P type semiconductor elements 1 and 2 there are secured metal strips 7 by means of brazing or soldering. In this manner, the N type semiconductor elements 1 and P type semiconductor elements 2 are arranged alternately and are connected in cascade by means of the metal strips 6 and 7. In this case, it has been proposed to secure the metal strips 7 simultaneously to the semiconductor elements 1 and 2 by using an insulating plate on which a metal electrode pattern is previously formed.

When a large capacity thermoelectric conversion module including a large number of thermoelectric elements is to be manufactured by the known method shown in FIG. 2, extremely high working precision and high assembling faculty are required, thereby increasing manufacturing cost. Moreover, it is impossible to manufacture a thermoelectric conversion module having a curved surface. Such a curved surface is required when a thermoelectric conversion module is secured to a base member having a curved surface. In this manner, the module made by this known method could not be used in various applications. For instance, when the thermoelectric conversion module is applied to a system in which electric power is generated by using waste heat of an internal combustion engine, a space for providing the thermoelectric conversion module is limited and in many cases it is desired to provide the thermoelectric conversion module on a curved surface. However, the module made by the above mentioned known method can not have a curved surface, and therefore can not be applied to such a thermoelectric power system.

In Japanese Patent Publications Nos. 58-199578 (JP 58-199578), 61-263176 (JP 61-263176), 5-283753 (JP 5-283753), 7-162039 (JP 7-162039) and 8-18109 (JP 8-18109), there are disclosed various known methods of manufacturing thermoelectric conversion modules. In JP 58-199578, after N type semiconductor elements and P type semiconductor elements are arranged alternately, spaces between adjacent semiconductor elements are filled with an adhesive agent. In JP 61-263176, there is described a method, in which an N type semiconductor layer and a P type semiconductor layer are successively deposited one on the other, spaces other than contact regions of these layers are filled with a glassy material. In a method disclosed in JP 5-283753, N type semiconductor elements and P type semiconductor elements are alternately arranged in a porous heat resisting insulating member. Further, in JP 7-162039, there is described a method, in which a single array of through holes are formed in a mold body and N type semiconductor elements and P type semiconductor elements are alternately inserted in these through holes. Finally, in JP 8-18109, there is disclosed a thermoelectric element having N type and P type semiconductor elements and an insulating material such as synthetic resin, ceramic and glass filling spaces between adjacent semiconductor elements. Such a thermoelectric element is formed by depositing an N type semiconductor layer on a glass substrate, depositing a P type semiconductor layer on a glass substrate, cutting these glass substrates and semiconductor layers with a dicing machine to obtain members in which pillar-like N type and P type semiconductor elements are aligned, assembling these members such that the N type semiconductor elements and P type semiconductor elements are arranged alternately, and filling spaces between these semiconductor elements with an insulating material.

In the known method described in JP 58-199578, the arrangement of the N type and P type semiconductor elements requires very complicated work, high working precision and high assembling faculty, thereby increasing manufacturing costs. In the known method described in JP 61-263176, due to a difference in a thermal expansion coefficient between the semiconductor material and the glassy material, the thermoelectric conversion module is subjected to damage through heat cycle and has a short life time. In the known methods disclosed in JP 5-0283753 and 7-162039, the insertion of the N type and P type semiconductor elements into the holes of the insulating substrate requires high working precision and faculty, thereby increasing manufacturing costs becomes very high. Furthermore, the thermoelectric conversion module might be damaged through a heat cycle due to a difference in thermal expansion coefficient. In the known method proposed in JP 8-18109, the array of semiconductor elements is formed by the dicing machine, it is very difficult to manufacture a thermoelectric conversion module having a small size. Therefore, a capacity of the thermoelectric conversion module is limited. Further, due to a difference in thermal expansion coefficient between the semiconductor elements and the insulating material, the thermoelectric conversion module might be damaged and its durability is also limited.

Furthermore, in known thermoelectric conversion module manufactured by known methods using the insulating substrate and/or insulating filler material, there is a drawback that these materials might be eluted or burned during a usage and surrounding substances may be contaminated thereby. Particularly, the semiconductor elements which are located in the vicinity of the substrate and filler material might be contaminated, and thus the property of the semiconductor elements might be deteriorated and a thermoelectric conversion efficiency might be decreased.

SUMMARY OF THE INVENTION

The present invention has for its object to provide a useful and novel method of manufacturing a thermoelectric conversion module having a large capacity and a curved surface and not contaminating surrounding substances, in an accurate, simple and less expensive manner.

According to the invention, a method of manufacturing a thermoelectric conversion module comprises the steps of:

preparing a honeycomb structural body having a first surface, a second surface opposing to said first surface, and a plurality of channels which extend from said first surface to said second surface, alternate one or more of said channels being classified into a first group and the remaining channel being classified into a second group;

inserting N type and P type semiconductor strips into the channels belonging to the first and second groups, respectively;

filling spaces formed between walls defining the channels and the semiconductor elements inserted therein with filler members;

cutting said honeycomb structural body into a plurality of thermoelectric conversion module main bodies of a desired shape, each of which has N type and P type semiconductor elements provided within said channels and exposed at mutually opposing first and second surfaces;

forming metal electrodes on opposite surfaces of said thermoelectric conversion module main body such that adjacent one or more N type semiconductor elements and one or more P type semiconductor elements are connected in cascade by means of said metal electrodes; and removing said filler members or said honeycomb structural body and filler members.

In the method according to the invention, after inserting the semiconductor strips into the channels of the honeycomb structural body and positioning these semiconductor strips by means of the filler members, the honeycomb structural body is cut into a plurality of honeycomb structural main bodies. Therefore, a required precision for the honeycomb structural body and semiconductor strips is reduced, and a yield of the honeycomb conversion module main body is improved. In this manner, it is possible to manufacture a thermoelectric conversion module having large capacity and curved surface in an accurate, simple and less expensive manner. Moreover, the filler members of the honeycomb structural body and filler members are removed after cutting, undesired contamination of surrounding substances due to the fusing and burning of these materials can be effectively prevented. Furthermore, these materials can be easily selected from a wide group, and thus manufacturing costs can be decreased.

DESCRIPTION OF THE PREFERRED EMBODIMENTS

FIGS. 3A–3F show successive steps of an embodiment of the method of manufacturing the thermoelectric conversion module according to the invention.

Figure 1:
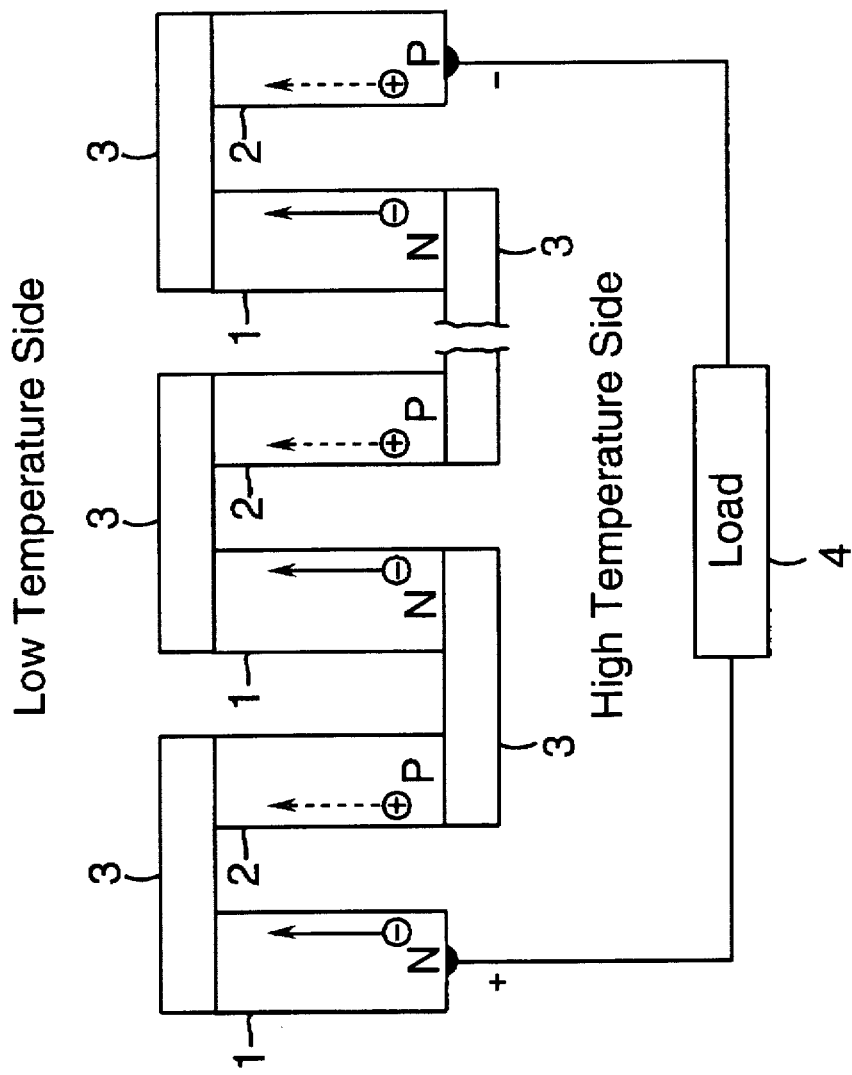
FIG. 1 is a schematic view showing a known thermoelectric conversion module.
Figure 2:
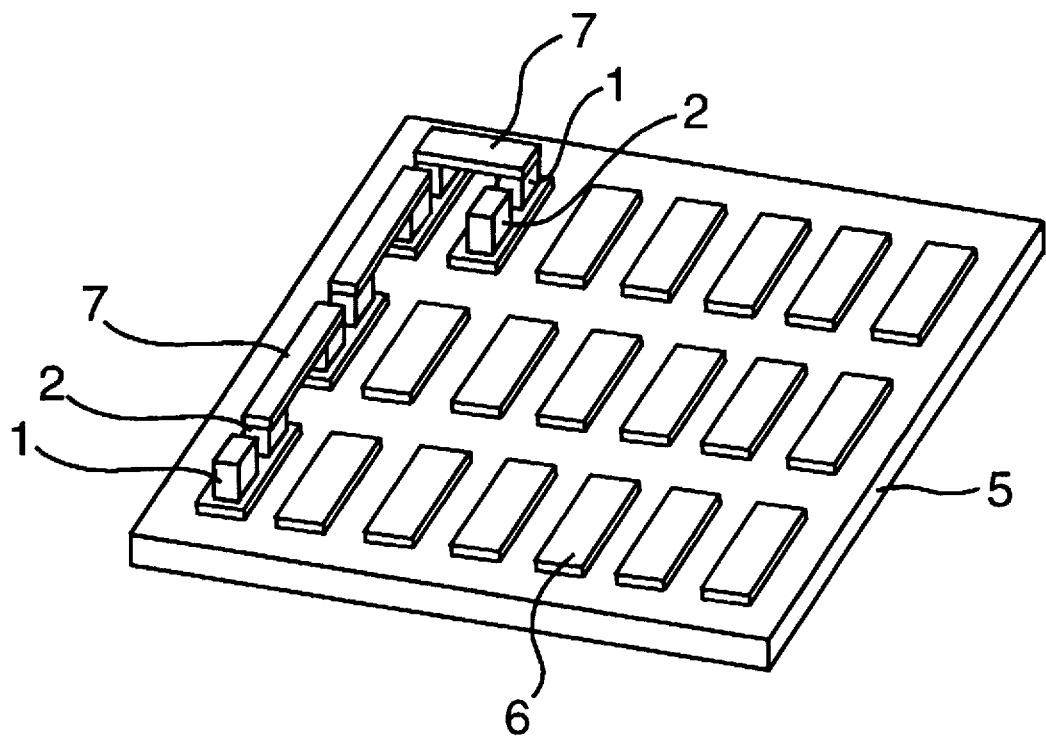
FIG. 2 is a perspective view illustrating a known method of manufacturing the thermoelectric conversion module.
Figure 3A:
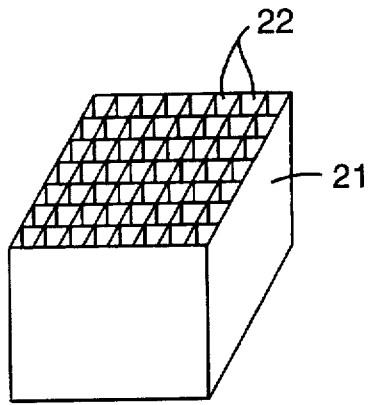
FIGS. 3A–3F are views showing successive steps of an embodiment of the method according to the invention.

At first, as illustrated in FIG. 3A, an electrically insulating honeycomb structural body 21 having a large number of channels 22 formed therein is prepared. In the present embodiment, the channels 22 are formed in the shape of square through holes each having a cross sectional area of 25 mm$^2$ (one side is 5 mm). This honeycomb structural body 21 is made of cordierite ($Mg_2Al(AlSi_5)O_{18}$) and has a height of 10 cm. In the present embodiment, a lateral cross section of a through hole 22 has a square shape, but according to the invention, the through hole may have any arbitrary cross sectional shape such as circular, triangular, rectangular and hexagonal. In FIG. 3A, the through hole 22 is drawn to have a large dimension in comparison with the honeycomb structural body 21 for the sake of clarity, so that the number of through holes are shown to be small, but in an actual module, a very large number of through holes 22 each having a very small cross section are formed.

Figure 3D:
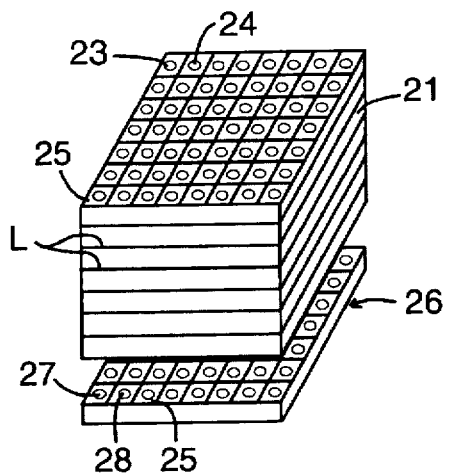
Figure 3B:
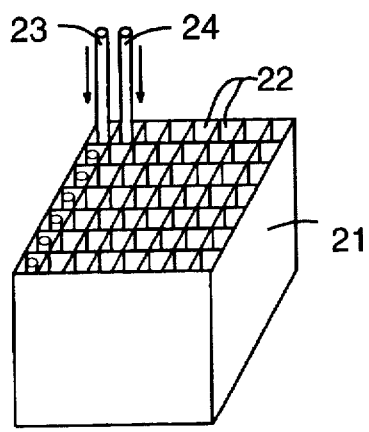

Next, as illustrated in FIG. 3B, N type semiconductor strips 23 and P type semiconductor strips 24 are inserted into alternate through holes 22. In the present embodiment, the N type semiconductor strip 23 is made of $Si_{0.8}Ge_{0.2}$ containing phosphorus (P) by 0.2 weight % as N type dopant, and P type semiconductor strip 24 is made of $Si_{0.8}Ge_{0.2}$ containing boron (B) by 0.05 weight % as P type dopant. In the present embodiment, the semiconductor strips 23 and 24 have a circular cross section having a diameter of 4 mm and a length of not less than 10 cm. According to the invention, the semiconductor strips may have any desired cross sectional shape such as square, triangular, and rectangular shapes. It should be noted that the N type and P type semiconductor strips 23 and 24 may be inserted into successive through holes 22 alternately or the N type semiconductor strips may be inserted into every other through hole one by one or simultaneously and then the P type semiconductor strips may be inserted into the remaining through holes one by one or simultaneously.

Figure 3E:
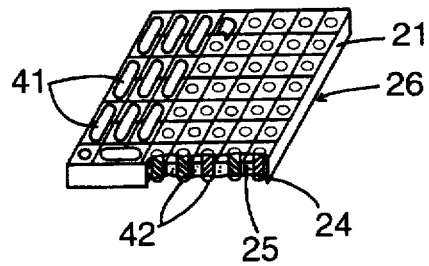
Figure 3C:
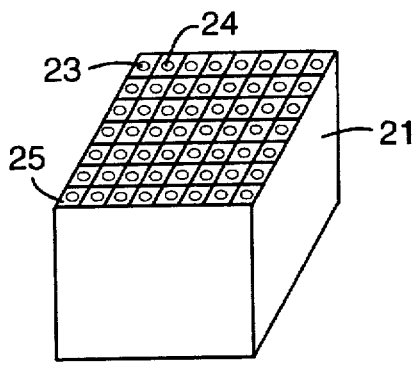

Next, as illustrated in FIG. 3C, spaces between the walls defining the through holes 22 and the semiconductor strips 23, 24 are filled with a filler members 25. This may be conducted by immersing the honeycomb structural body 21 having the semiconductor strips 23, 24 inserted therein into a melt or a filler material. Alternatively, a lower end of the honeycomb structural body 21 may be inserted into a melt of the material. Alternatively, a lower end of the honeycomb filer material to suck the molten material into the spaces between the walls and the semiconductor strips 23, 24 by an action of the capillary phenomenon.

Then, after drying the filler material melt to form the electrically insulating filler members 25 within the through holes 22, the honeycomb structural body 21 is cut along a plane L which is perpendicular to the through holes 22 as shown in FIG. 3D into a plurality of thermoelectric conversion module main bodies 26 each having a thickness of, for instance 5 mm. By this cutting process, the N type and P type semiconductor strips 23 and 24 are also cut to constitute N type and P type semiconductor elements 27 and 28 in each of the thermoelectric conversion module main body. Next, as shown in FIG. 3E, on upper and lower surfaces of a thermoelectric conversion module main body 26 are provided metal electrodes 41 and 42 such that the N type semiconductor elements 27 and P type semiconductor elements 28 are alternately connected in series by means of the electrodes 41 and 42.

Figure 3F:
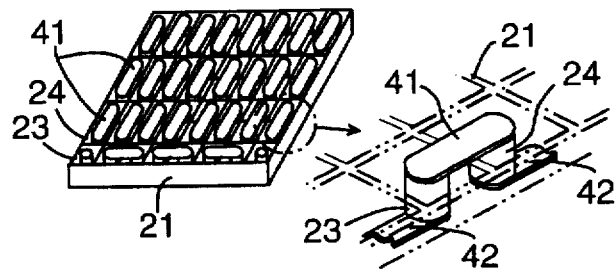

Finally as depicted in FIG. 3F, all the filler members 25 are removed to form a final thermoelectric conversion module. For instance, the filler members 25 may be made of a synthetic resin. Then, the filler members 25 can be simply removed by immersing the assembly illustrated in FIG. 3E into an etchant which can elute the synthetic resin.

In the present embodiment, since the filler members 25 are removed in the final thermoelectric conversion module, surrounding substances are free from contamination due to melting and burning of the filler member material.

Figure 4A:
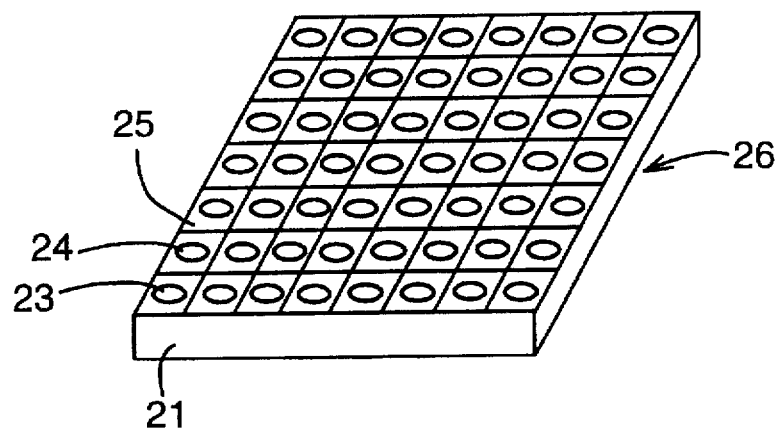
FIGS. 4A–4C are successive steps of another embodiment of the method of manufacturing the thermoelectric conversion module according to the invention.
Figure 4B:
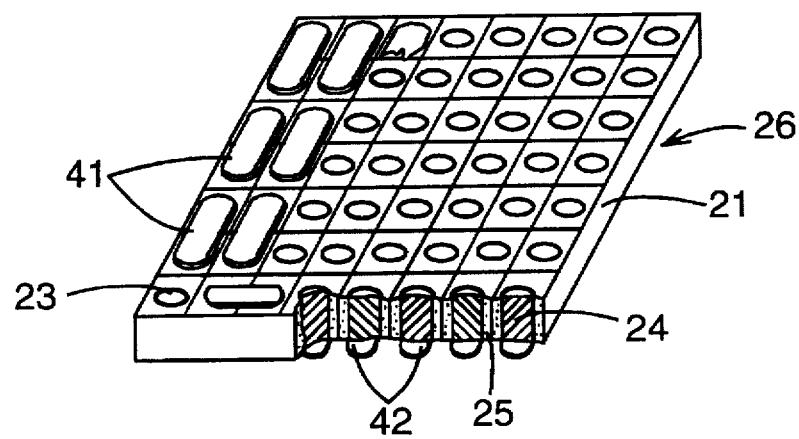
Figure 4C:
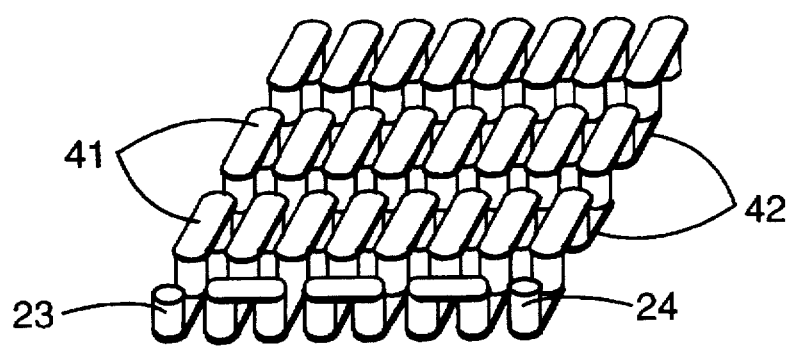

FIGS. 4A–4C show successive steps of another embodiment of the method according to the invention. In the previously explained embodiment, only the filler members 25 are removed, but in the present embodiment, both the filler members and honeycomb structural body are removed. FIG. 4A depicts the thermoelectric conversion module main body 26 which is formed by the same process as the previous embodiment. Next, as illustrated in FIG. 4B, adjacent N type and P type semiconductor elements 27 and 28 are connected by means of metal strip electrodes 41 and 42 in upper and lower surfaces of the thermoelectric conversion module main body 26. In this manner, all the N type and P type semiconductor elements 27 and 28 are alternately connected in cascade. Then, the whole assembly is immersed into an etchant which can etch both the honeycomb structural body 21 and filler members 25. In this manner, the honeycomb structural body 21 and filler members 25 are completely removed to obtain a final thermoelectric conversion module shown in FIG. 4C.

In the present embodiment, since both the honeycomb structural body 21 and filler members 25 are removed, they can be made of any kind of material which can be removed easily. Further, it is not necessary to make the honeycomb structural body 21 of an electrically insulating material, and indeed it may be made of inexpensive material such as resin and pulp.

When a mechanical strength of the thermoelectric conversion modules manufactured by the method according to the invention is smaller than a required value, one or both surfaces of the thermoelectric conversion module may be covered with a reinforcing plate made of an electrically insulating material.

Furthermore, in the above embodiment, both the upper and lower surfaces of the thermoelectric conversion module are formed to be flat. According to the invention, one or both surfaces of the thermoelectric conversion module may be curved. In this case, a surface configuration of the upper surface of the thermoelectric conversion member may be different from that of the lower surface.

As explained above in detail, according to the invention, after inserting the semiconductor strips into the through holes formed in the honeycomb structural body and filling the spaces between the semiconductor strips and the walls defining the through holes with the filler members to hold the semiconductor strips in position within the through holes, the honeycomb structural body is cut into the thermoelectric conversion module main bodies. Therefore, it is possible to form easily the thermoelectric conversion module main body having a large capacity and a desired surface configuration in an easy, accurate and less expensive manner. Moreover, after providing the electrodes, the filler members or the honeycomb structural body are removed, and thus surrounding substances are not contaminated by these materials during usage. Furthermore, these materials can be easily selected from a wide group, thereby reducing manufacturing cost.

What is claimed is:

1. A method of manufacturing a thermoelectric conversion module comprising the steps of:

preparing a honeycomb structural body having a first surface, a second surface opposed to said first surface, and a plurality of channels which extend from said first surface to said second surface, alternate one or more of said channels being classified into a first group and the remaining channels being classified into a second group;

inserting N type and P type semiconductor strips into the channels belonging to the first and second groups, respectively;

filling spaces formed between walls defining the channels and the semiconductor, strips inserted therein with filler members;

cutting said honeycomb structural body into a plurality of thermoelectric conversion module main bodies, each of the bodies having N type and P type semiconductor elements provided within said channels exposed at mutually opposing first and second surfaces;

forming metal electrodes on opposite surfaces of said each of the bodies such that adjacent one or more N type semiconductor elements and one or more P type semiconductor elements are connected in cascade by means of said metal electrodes; and removing said filler members or said honeycomb structural body and filler members.

2. A method according to claim 1, wherein said filling step by immersing the honeycomb structural body having the semiconductor strips inserted therein into a melt of a material of the filler members.

3. A method according to claim 1, wherein said filling step comprises sucking, of a capillary action, a melt by way of material of the filler members into the spaces formed between the walls of the honeycomb structural body and the semiconductor elements.

4. A method according to claim 1, wherein said removing step comprises immersing said each of the bodies into an etchant which can etch the filler members.

5. A method according to claim 1, wherein said cutting step is performed such that at least one of the surfaces of said each of the bodies is shaped into a curved configuration.

* * * * *